United States Patent
Baldwin et al.

[11] Patent Number: 5,909,135
[45] Date of Patent: Jun. 1, 1999

[54] HIGH-SIDE MOSFET GATE PROTECTION SHUNT CIRCUIT

[75] Inventors: David J. Baldwin, Allen; Andrew Marshall, Dallas, both of Tex.

[73] Assignee: Texas Instruments Incorporated, Dallas, Tex.

[21] Appl. No.: 08/992,414

[22] Filed: Dec. 17, 1997

Related U.S. Application Data

[60] Provisional application No. 60/033,689, Dec. 19, 1996.

[51] Int. Cl.$^6$ ...................................................... H03K 5/08
[52] U.S. Cl. .......................... 327/328; 327/110; 327/309; 327/427
[58] Field of Search ................... 327/110, 309, 327/310, 312, 313, 318, 319, 321, 322, 327, 328, 427

[56] References Cited

U.S. PATENT DOCUMENTS

| | | | |
|---|---|---|---|
| 5,010,439 | 4/1991 | Zisa et al. ................... | 361/91 |
| 5,361,008 | 11/1994 | Saijo ........................ | 327/427 |
| 5,828,141 | 10/1998 | Foerster .................... | 307/125 |

*Primary Examiner*—Timothy P. Callahan
*Assistant Examiner*—Jeffrey Zweizig
*Attorney, Agent, or Firm*—W. James Brady, III; Richard L. Donaldson

[57] ABSTRACT

A high-side MOSFET gate protection shunt circuit is provided for protecting an output driving transistor (10). The output driving transistor (10) is operable to drive a load (18) on an output node (12). A sense resistor (26) is disposed between the supply voltage terminal and the output node (12). The gate of transistor (10) is driven by a current limited driver (20). In order to prevent the voltage across the gate oxide of transistor (10) from exceeding a predetermined voltage above which would be destructive to the transistor, a bypass transistor (32) is disposed between the output of the MOSFET driver (14) and the supply terminal (11). The gate of this transistor (32) is connected to the output node (12), such that the voltage on the gate of transistor (10) is limited to one threshold voltage below the voltage on the output node (12).

8 Claims, 3 Drawing Sheets

TRANSIENT RESPONSE

TIME
TRANSIENT RESPONSE

HIGH-SIDE MOSFET GATE PROTECTION SHUNT CIRCUIT

This application claims priority under 35 USC § 119(e)(1) of provisional application No. 60/033,689 filed Dec. 19, 1996.

TECHNICAL FIELD OF THE INVENTION

The present invention pertains in general to integrated circuit protection devices and, more particularly, to a protection device that is disposed between the gate of a MOSFET transistor and the source or drain thereof.

BACKGROUND OF THE INVENTION

MOSFETs are fabricated with a source, a gate, and a drain, with the source and drains typically defined within a semiconductor substrate as defined regions. The source/drain regions are separated by a channel, over which a gate electrode is disposed. The gate electrode is separated from the channel region by a thin layer of gate oxide. The thickness of the gate oxide will determine certain properties of the transistor, and it is typically fabricated as thin as possible. However, as the gate oxide is decreased in thickness, the voltage breakdown of the oxide will decrease. For example, in 3-volt transistors, a voltage in excess of 5 or 6 volts can cause stress on the gate oxide, which will be destructive to the transistor. Therefore, numerous devices have been provided for preventing the gate oxide breakdown voltage of any transistor from exceeding its gate-to-source or gate-to-drain breakdown voltage.

In one application of a MOSFET, a driving circuit is provided for driving an inductive load, such as a motor. When the device is turned off, there will be a resulting back emf that will drive the voltage on the output node to a high voltage. Since the gate of the driving transistor is typically pulled low, this will result in the voltage across the source and gate exceeding the gate-to-source breakdown voltage thereof. To solve this problem, back-to-back zener or diodes are disposed between the gate and source of the transistor. When the voltage rises above the breakdown voltage of the zener, current will be conducted and there will be a voltage limit across the gate and source. However, this current must flow through the zeners and the driving circuitry to ground, thus causing both dissipation in the zener diodes and dissipation in the driving circuitry, which can be excessive for high back emf voltages.

SUMMARY OF THE INVENTION

The present invention disclosed and claimed herein comprises a gate protection circuit for a driver MOSFET having the source/drain path thereof connected between a supply voltage and an output to which a load is connected. The gate protection circuit includes a current limited driver for driving the gate of the driver MOSFET to a high voltage to render it conductive during an operating mode and to a low voltage during an isolation mode to render the driver MOSFET nonconductive. A bypass device is connected between the supply voltage and the output of the current limited driver for supplying current thereto as a function of the output voltage on the output node. As such, the current that is supplied through the bypass device to the output of the current limited driver is at such a level to limit the voltage across the gate-source of the driver MOSFET to a predetermined maximum voltage. This prevents the current from flowing from the output to the current limited driver when the current limited driver is driving the gate of the driver MOSFET low.

In another aspect of the present invention, the bypass device comprises a bypass N-channel transistor having the source/drain thereof disposed between the supply voltage and the output of the current limited driver, with the gate thereof connected to the output. When the voltage on the output of the current limited driver falls at least one threshold voltage below the voltage on the output node, sufficient current will be drawn through the bypass transistor to maintain this voltage.

In a further aspect of the present invention, a sense resistor is disposed in parallel with the source/drain path of the driver MOSFET. Current flows through the sense resistor during the isolation mode. The bypass transistor provides the limiting function of the voltage across the gate-source of the driver MOSFET without requiring current to flow through the sense resistor to the output of the current limited driver.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
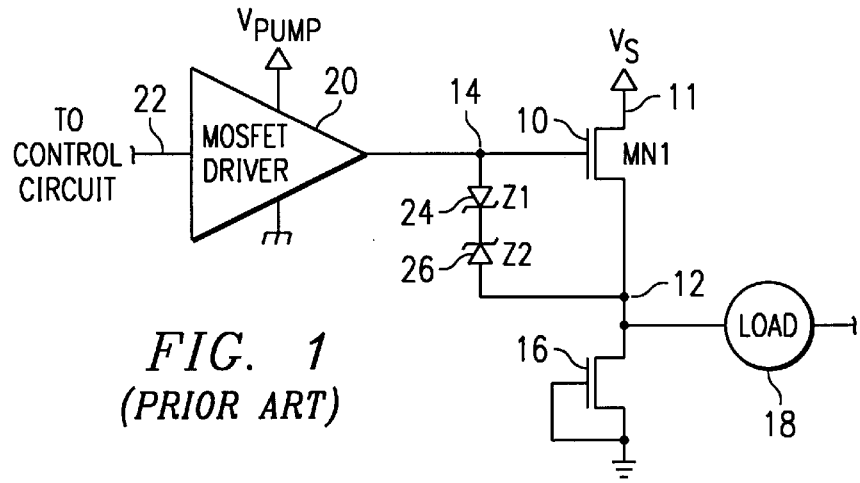
FIG. 1 illustrates a schematic diagram of a prior art gate-to-source voltage clamp circuit.

Referring now to FIG. 1, there is illustrated a schematic diagram of a prior art gate-to-source voltage clamp circuit. The output driving circuitry is comprised of an N-channel transistor 10, having the drain thereof connected to a supply node 12 labeled $V_S$, the source thereof connected to an output node 12 and the gate thereof connected to a gate node 14. The output node 12 is connected to the drain of an N-channel transistor 16, the gate and source thereof connected to ground. The output node 12 is also connected to one side of a load 18, the load 18 being realized with an inductive load, such as a motor. As such, when the voltage is disconnected, i.e., voltage and current are disconnected from the load 18, there is the possibility of a back emf voltage. The transistors 10 and 16 form one-half of a bridge network, wherein the switching operation of transistor 10 would allow an operation where it can be switched to a tri-state condition, i.e., the output will "float."

The gate of transistor 10 on node 14 is connected to the output of the MOSFET driver circuit 20. The MOSFET driver circuit 20 is a driver circuit that provides a current limited output when the output on node 14 is pulled to a voltage $V_{PUMP}$ or pulled to ground. The voltage $V_{PUMP}$ is equal to the supply voltage plus an additional voltage, such as 10 volts. Therefore, the pump voltage will be equal to $V_S+10$. However, whenever the MOSFET driver 20 is controlled by a control circuit on an input 22 to pull the output high, current will be drawn from the $V_{PUMP}$ supply and input to node 14, but the current thereto will be limited. Further, whenever the node 14 is pulled low, it will only be able to pull a finite amount of current from node 14.

In order to protect the gate oxide of transistor 10, a back-to-back zener circuit is utilized comprised of a zener diode 24 having the anode thereof connected to node 14 and the cathode thereof connected to the cathode of a zener diode 26, the anode of zener diode 26 connected to the node 12. In operation, whenever node 14 is pulled low, there is the possibility that a back emf will cause node 12 to go high. This could be as high as 20 volts. When this occurs, the zener diode 26 labeled Z2 will conduct in the forward direction and the zener diode 24 labeled Z1 will not conduct until the voltage thereacross exceeds its zener breakdown voltage. This is typically 10 volts. Therefore, the voltage across the combination of the zener diodes 24 and 26 will be the combination of the zener breakdown voltage of zener diode 24 and the forward voltage drop across diode 26. This will be approximately 11 volts. Therefore, current will flow through the zener diodes 24 and 26 to node 14 and then to ground through the driver 20. The driver 20, as noted above, is current limited, such that the voltage on node 14 will be 11 volts below the voltage on the node 12. This current will continue to be drawn through the zener diodes 24 and 26 and the MOSFET driver 20 until the voltage on node 12 is lowered to a voltage that is less than 11 volts, at which time current will cease to be drawn through zener diodes 24 and 26. Additionally, whenever the MOSFET driver 20 pulls the node 14 high, the voltage thereon will go to a voltage of approximately 20 volts. If the initial voltage on node 12 is low, then the zener diode 24 will conduct in the forward direction and zener diode 26 will break down at a voltage of 10 volts. Therefore, node 14 cannot be more than 11 volts above node 12. The current limit aspect of the MOSFET driver 20 will prevent the node 14 from rising higher than that level. However, as node 12 is pulled high, node 14 will be pulled up to the supply voltage. The zener diodes 24 and 26 insure that no more than 11 volts is disposed across the gate oxide layer of the transistor 10 between the gate and source. As noted above, the disadvantage to the current system is that all of the power dissipation must be handled by the MOSFET driver 20 and the zener diodes 24 and 26. Further, as will be described hereinbelow, if a sense operation of current to the load 18 is facilitated with an external sense transistor (not shown), then current that is supplied to the node 12 when transistor 10 is turned off will be the combination of the current to the load 18 and the current to the zener diodes 24 and 26 and the MOSFET driver 20. In some applications, this will provide an incorrect sensing operation during a protection operation.

Figure 1A:
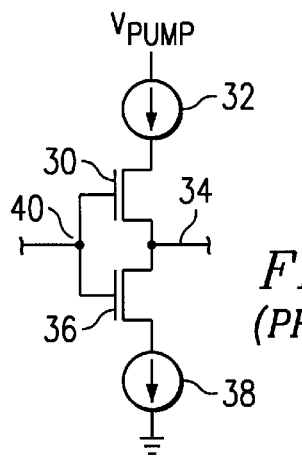
FIG. 1a illustrates a schematic representation of the output circuitry that is turned into the MOSFET driver circuit.

Referring now to FIG. 1a, there is illustrated a schematic representation of the output driving circuit of the MOSFET driver 20. The MOSFET driver 20 is comprised of an inverting structure of the CMOS transistor comprised of a P-channel transistor 30 having the source/drain path thereof connected between a current source 32 and an output node 34, output node 34 connected to the node 14. The other side of the current source 32 is connected to the $V_{PUMP}$ supply input. The node 34 is also connected through the source/drain path of an N-channel transistor 36 to a current source 38. Current source 38 has the other side thereof connected to ground. The gates of transistors 30 and 36 are connected together and to a node 40, this being an input. It can be seen that whenever either of the transistors 30 or 36 are turned on, they can only provide a finite amount of current as determined by the respective current sources 32 and 38. This therefore provides a current limited operation.

Figure 2:
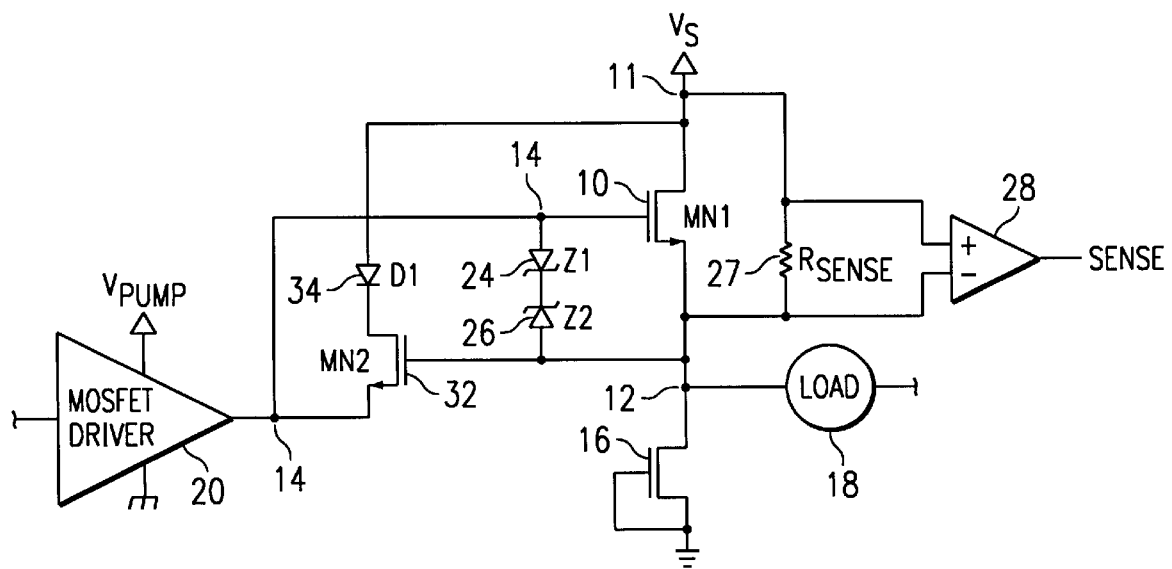
FIG. 2 illustrates a schematic diagram of one embodiment of the present invention for the high-side MOSFET gate protection circuit.

Referring now to FIG. 2, there is illustrated a schematic diagram of the high-side MOSFET gate protection shunt for one embodiment in accordance with the present invention. The transistor 10 has disposed across the source/drain thereof a sense resistor 27, the sense resistor 27 being a fairly high impedance to allow the current to bypass around the source/drain of the transistor 10 between the supply rail 11 and the output node 12 to provide a trickle current to the load 18. The voltage across the transistor is sensed with a differential amplifier 28. This sense resistor 27 allows the current to the load to be determined when the transistor 10 is turned off, this resistor 27 and the sense operation associated therewith being associated with such things as speed control. However, it can be seen that, whenever the transistor 10 is turned off, the current through the resistor 27 when utilized in the prior art circuit of FIG. 1 would be the current from the supply rail 11 to the node 12 and the load 18, and also to the node 14 through the zener diodes 24 and 26. This would result in the measurement of current to the load during the nonconducting or tri-state mode to be in error.

The improvement made to the circuit of FIG. 1 is facilitated with a separate current path directly from the power supply rail 11 to the node 14. This is facilitated by disposing the source/drain path of an N-channel transistor 32 between the node 14 and the power supply rail. The source of the transistor 32 is connected to the node 32 and the drain connected to the cathode of a diode 34, the anode thereof connected to the supply rail 11. The gate of transistor 32 is connected to the output node 12.

In operation of the transistor 32, whenever the transistor 10 is turned on, the node 14 will be at least one threshold voltage $V_T$ above the source thereof on the output node 12, this resulting in the source of transistor 32 being higher than the gate thereof, thus allowing transistor 10 to conduct and turning off transistor 32. When transistor 10 is subsequently turned off, the node 14 is pulled low, which as soon as it falls below a threshold voltage above the node 12, will turn off the transistor 10. However, as the node 14 falls to one threshold below the voltage on the output node 12, transistor 32 will begin to conduct, drawing current from the supply rail 11 to the MOSFET driver 20. Since this is a current limited driver output, node 14 will only be pulled to a threshold voltage below the output 12. As the output on node 12 decays, node 14 will fall in voltage. However, it is noted that the current provided to node 14 is derived from the power supply rail and not the output node 12, such that current flowing to the output node 12 from the supply through the sense resistor 27 will not be comprised of any current from the node 14. This is due to the high impedance nature of the gate input to the N-channel transistor 32. Therefore, the node 12 is allowed to float, with the transistor 32 preventing the gate of transistor 10 from being pulled more than one threshold voltage of the transistor 32 below node 12.

Figure 3:
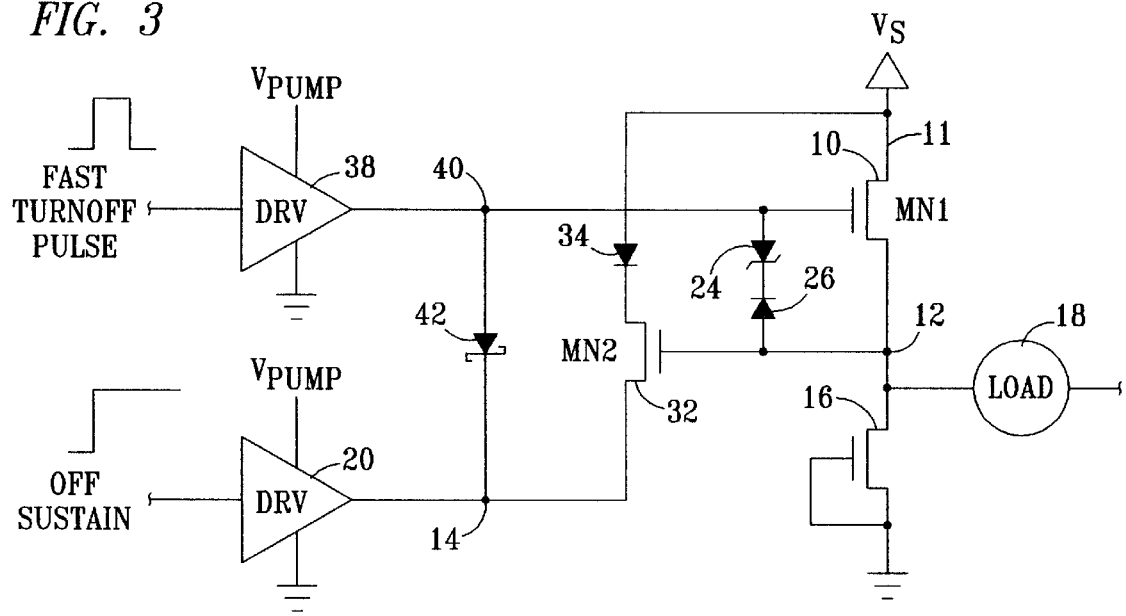
FIG. 3 illustrates an alternate embodiment of the present invention for a gate protection shunt with a fast-turnoff circuit.

Referring now to FIG. 3, there is illustrated an alternate embodiment of the present invention. For simplicity, the sense resistor 27 is not shown. In the embodiment of FIG. 3, the gate of transistor 10, instead of being connected directly to node 14, is disconnected to an intermediate node 40. Intermediate node 40 is connected through a Shottky diode 42 to node 14, with the anode of diode 42 connected to node 40 and a cathode thereof connected to node 14. The node 40 is driven by a fast turn-on driver circuit 38, which receives on the input thereof a short turn-on pulse. The driver circuit 38 is not a current limited driver, such that whenever the input thereof goes high, the output thereof will go to ground and immediately pull the gate of transistor 10 low. Of course, the source of transistor 32 will not be pulled low due to the blocking operation of diode 42. This will cause a fast rising edge of the pulse to occur on node 40, the gate of transistor 10 to be pulled low immediately, turning off transistor 10, due to the low impedance of the driver 38 output. Additionally, if the voltage is sufficiently high, diode 26 will conduct through the zener diode 24 after the voltage across the diode 24 exceeds its zener breakdown voltage. This, of course, will provide a voltage limiting function, such that the voltage on the node 40 will be limited to the zener breakdown voltage of diode 24 and the forward diode drop of diode 26. At the same time that the fast turn-on pulse goes high, the input of the MOSFET driver 20 will also go high and remain high. As soon as the driver 38 releases node 40, when the input thereof goes low, node 14 will be pulled low, turning on transistor 32 once the node 14 is pulled one threshold voltage below the output of node 12. This can, of course, occur at the same time that node 40 is pulled to ground. Once the output driver 38 is turned off, the operation will continue as described hereinabove with respect to FIG. 2.

Figure 4:
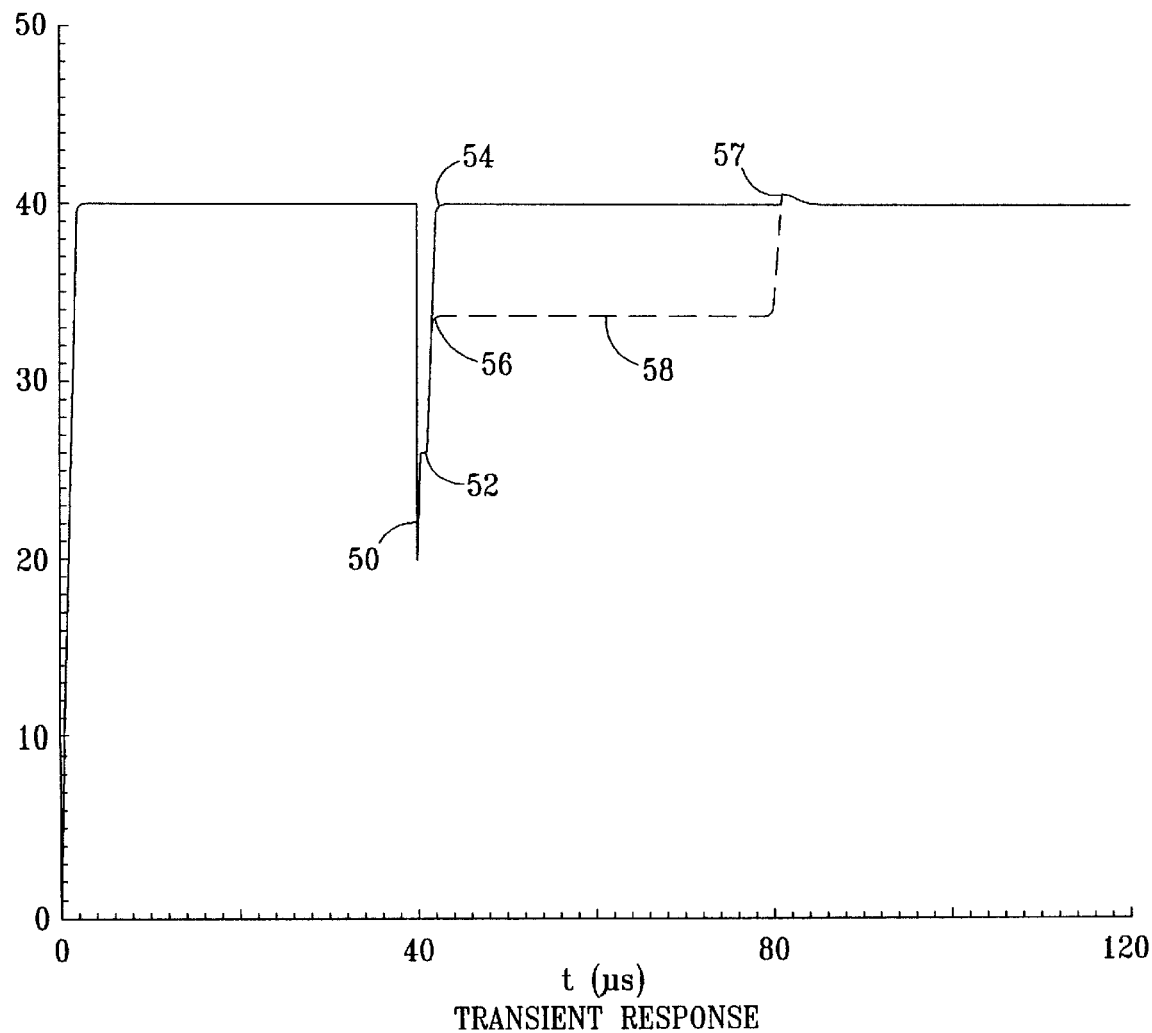
FIG. 4 illustrates a transient response of the voltage output for the tri-stated output as flowing to the supply voltage.

Referring now to FIG. 4, there is illustrated a transient response of the voltage for both the circuit of FIG. 3 and the prior art circuit of FIG. 1, the prior art circuit illustrated in phantom. When the switch is initially turned off, there will be a negative going transient, as represented by a point 50. This is due to the fast turn-on driver 38. This will be immediately voltage limited by the zener diodes, as indicated by the point 52. This will continue until the end of the fast turn-on pulse, at which time the voltage will rise back up to the supply voltage at a point 54. This will continue for, in the present example, 40 microseconds, to a point 56, at which time the switch is turned back on. By comparison, the prior art system would not allow the voltage to rise from the point 52 to the point 54. It would be voltage limited at the point 56, as represented by a phantom line. This would continue at a level as indicated by the phantom line 58 to the point 57, which then causes the voltage to rise back to the full supply voltage level. During the time that the voltage resides at the level 58, current is being passed through the zener diodes 24 and 26. The present system allows the voltage to go up to the supply voltage level, since the current is being drawn through the transistor 32.

Figure 5:
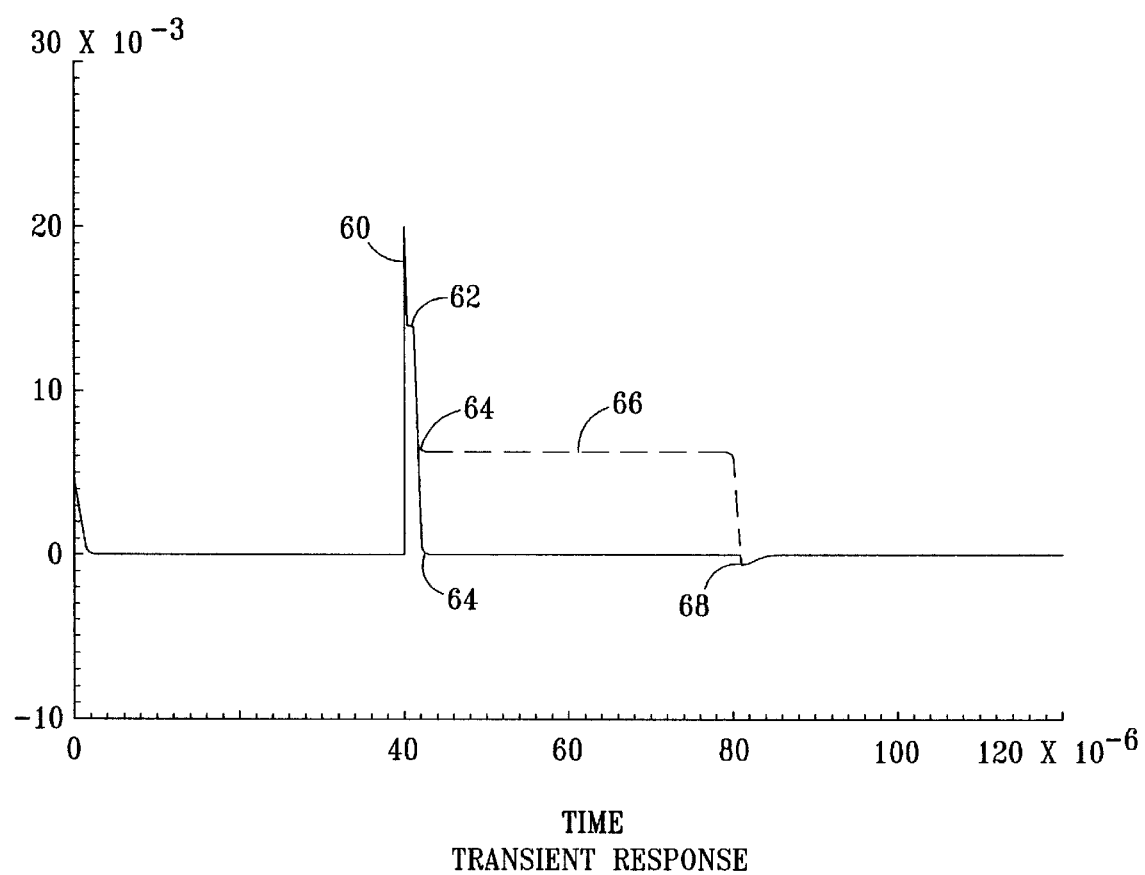
FIG. 5 illustrates a transient response of the current to the sensors illustrating only the transient current.

Referring now to FIG. 5, there is illustrated a plot of the transient current through resistor 26. The current initially rises to a peak at point 60, the result of the transistor 10 being turned off with the fast turn-off driver 38. The current will decrease when the zener diodes 24 and 26 begin to conduct at a point 62. When the fast turn-off pulse goes low, the current to resistor 26 will again go low at a point 64. The prior art system of FIG. 1 is illustrated in phantom and it can be seen that the current will change from a level at a point 62 to a level at a point 64, which is higher than the zero value. This is the current that flows through the resistor 26 to the zener diodes 24 and 26 in order to protect the gate oxide of transistor 10. This will be clamped at a level 66 from point 64 until the transistor 10 is turned on again at point 68. Therefore, the transient current through the resistor 26 is increased during the tri-state period as a result of the gate protection shunt in the prior art system consisting of diodes 24 and 26. By utilizing the structure described in the present invention, the transient current through the resistor 26 can be removed by providing a current path from the supply to the gate driving circuitry that is not sourced from the output node 12 to which the sense resistor is attached.

Although the preferred embodiment has been described in detail, it should be understood that various changes, substitutions and alterations can be made therein without departing from the spirit and scope of the invention as defined by the appended claims.

What is claimed is:

1. A gate protection circuit for a driver MOSFET having the source/drain path thereof connected between a supply voltage and an output node having a load connected thereto, comprising:

a current limited driver for driving the gate of the driver MOSFET to a high voltage such that the MOSFET is conductive during an operating mode, and a low voltage such that the MOSFET is nonconductive during an isolation mode; and a bypass device connected between the supply voltage and the output of said current limited driver for supplying current thereto as a function of the output voltage on the load such that current is supplied through said bypass device to the output of said current limited driver to limit the voltage across the gate-source of the driver MOSFET to a predetermined maximum voltage, such that current is not drawn from the load to the output of said current limited driver, wherein said current limited driver is operable, during the isolation mode, to sink current from the output thereof.

2. The gate protection circuit of claim 1, wherein said bypass device comprises a bypass transistor having the source/drain thereof connected between the power supply and the output of said current limited driver, with the gate thereof connected to the output node, wherein said bypass transistor will conduct when the voltage on the output driver is at least a threshold voltage below the voltage on the output node.

3. The gate protection circuit of claim 2, and further comprising a blocking diode disposed between the source/drain path of said bypass transistor and the power supply for conducting current only from the power supply through the source/drain of said bypass transistor and blocking current flow in the opposite direction.

4. The gate protection circuit of claim 1, and further comprising a sense resistor disposed in parallel with the source/drain of the driver MOSFET, such that current flows through said sense resistor during said isolation mode, and wherein said bypass device prevents current from flowing through said sense resistor to the output of said current limited driver.

5. The gate protection circuit of claim 1, and further comprising a back-to-back configured zener diode pair, disposed between the gate of the driver MOSFET and the output node, with the cathodes of the zener diodes connected together and the anodes thereof connected to the gate of the driver MOSFET and the output node, respectively.

6. The gate protection circuit of claim 1, and further comprising a fast turn-off driver for driving the gate of the driver MOSFET for a short period of time proximate in time to the initial change of the normal operating mode to the isolation mode, said fast turn-off driver operable to present a low impedance to the gate of the driver MOSFET when the driver MOSFET is changed from the operating mode to the isolation mode.

7. The gate protection circuit of claim 6, and further comprising an isolation diode connected between the output of the fast turn-off driver and the output of said current limited driver, such that current will only flow from the gate of the driver MOSFET through said blocking diode to the output of said current limited driver and not from the current limited driver to the output of said fast turn-off driver.

8. A method for protecting the gate of a driver MOSFET having the source/drain path thereof connected between a supply voltage and an output node, having a load connected thereto, comprising the steps of:

driving the gate of the driver MOSFET with a current limited driver to a high voltage such that the MOSFET is conductive during an operating mode, and a low voltage such that the MOSFET is nonconductive during an isolation mode; and bypassing current from the supply voltage to the output of the current limited driver through a bypass device to limit the voltage across the gate-source of the driver MOSFET to a predetermined maximum voltage, such that current is not drawn to the load from the output of the current limited driver, wherein the current limited driver is operable, during the isolation mode, to sink current from the output thereof.

* * * * *